US007226508B2

(12) United States Patent
Korus et al.

(10) Patent No.: US 7,226,508 B2
(45) Date of Patent: Jun. 5, 2007

(54) QUARTZ GLASS CRUCIBLE AND METHOD FOR THE PRODUCTION THEREOF

(75) Inventors: Gabriele Korus, Leipzig (DE); Martin Arndt, Bitterfeld (DE); Hilmar Laudahn, Bitterfeld (DE); Manfred Schwarzbauer, Simbach (DE)

(73) Assignees: Heraeus Quarzglas GmbH & Co. KG, Hanau (DE); Siltronic AG, Munich (DE)

( * ) Notice: Subject to any disclaimer, the term of this patent is extended or adjusted under 35 U.S.C. 154(b) by 0 days.

(21) Appl. No.: 10/512,114

(22) PCT Filed: Apr. 3, 2003

(86) PCT No.: PCT/EP03/03459

§ 371 (c)(1),
(2), (4) Date: Mar. 29, 2005

(87) PCT Pub. No.: WO03/089693

PCT Pub. Date: Oct. 30, 2003

(65) Prior Publication Data

US 2005/0178319 A1    Aug. 18, 2005

(30) Foreign Application Priority Data

Apr. 22, 2002  (DE) ................. 102 17 946

(51) Int. Cl.
*C30B 25/20* (2006.01)
(52) U.S. Cl. .................. 117/19; 65/32.2; 65/33.4; 65/33.6

(58) Field of Classification Search ................. 65/32.3, 65/33.4, 33.6; 117/12, 19; 428/34.4
See application file for complete search history.

(56) References Cited

U.S. PATENT DOCUMENTS

| 5,389,582 A | 2/1995 | Loxley et al. |
| 5,968,259 A | 10/1999 | Kemmochi et al. |
| 6,548,131 B1* | 4/2003 | Fabian et al. ............... 428/34.4 |
| 6,755,049 B2* | 6/2004 | Korus et al. ................. 65/17.3 |

FOREIGN PATENT DOCUMENTS

| EP | 0 748 885 A | 12/1996 |
| EP | 0 911 429 A | 4/1999 |
| WO | WO 00/46432 A | 8/2000 |
| WO | WO 02/16677 A | 2/2002 |

* cited by examiner

*Primary Examiner*—Felisa Hiteshew
(74) *Attorney, Agent, or Firm*—Tiajoloff & Kelly

(57) ABSTRACT

A known quartz glass crucible for crystal pulling consists of a crucible wall, having an outer layer which is provided in an external area thereof with a crystallisation promoter which results in crystallisation of quartz glass, forming cristobalite when the quartz glass crucible is heated according to specified use in crystal pulling. The aim of the invention is to provide a quartz glass crucible which has a long service life. As a result, the crystallisation promoter contains, in addition to a silicon, a first component which acts as a reticulating agent in quartz glass and a second component which is free of alkali metals and which acts as an agent forming separating points in quartz glass. The above mentioned components are contained and incorporated into a doping area (8) of the outer layer (6) having a layer thickness of more than 0.2 mm.

Figure 1:
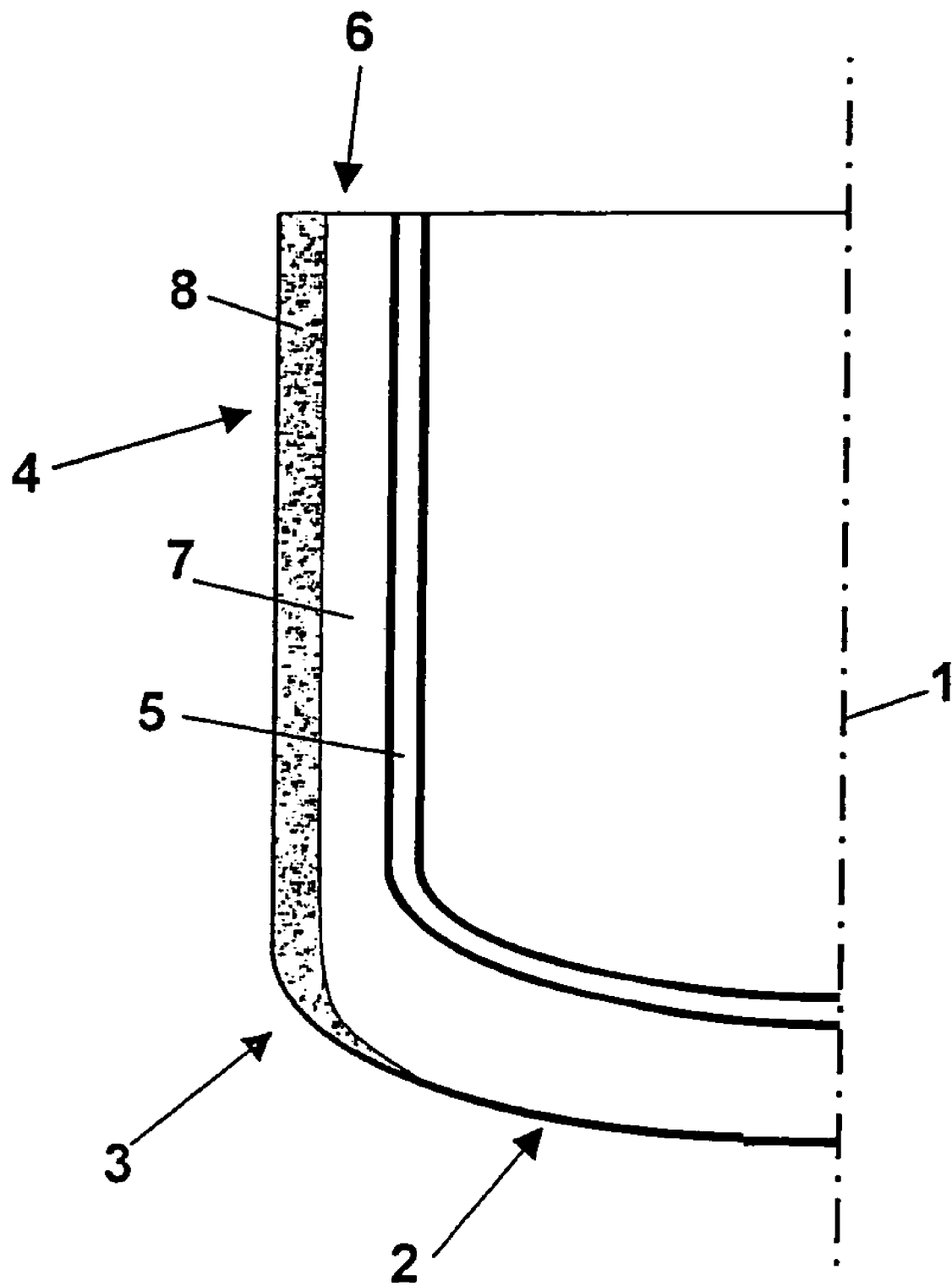

25 Claims, 1 Drawing Sheet

QUARTZ GLASS CRUCIBLE AND METHOD FOR THE PRODUCTION THEREOF

JOINT RESEARCH AGREEMENT

The invention of this application was developed under a joint research agreement between Heraeus Quarzglas GmbH (now Heraeus Quarzglas GmbH & Co. KG) and Wacker Siltronic AG (now Siltronic AG).

1. Field of the Invention

The present invention relates to a quartz glass crucible for crystal pulling with a crucible wall, comprising an outer layer of opaque quartz glass and an inner layer, wherein the outer layer has an inner region and an outer region, which is provided with a crystallization promoter that effects crystallization of quartz glass with formation of cristobalite when the quartz glass crucible is heated during intended use in crystal pulling.

The invention further relates to a method for manufacturing a quartz glass crucible by producing a crucible base body having an outer layer of opaque quartz glass and an inner layer, wherein the outer layer is provided at least in part with a crystallization promoter in an outer region surrounding an inner region, the crystallization promoter effecting crystallization of quartz glass with formation of cristobalite when the quartz glass crucible is heated during intended use in crystal pulling.

2. Background of the Invention

Quartz glass crucibles are used, for example, for receiving the metal melt when single crystals are pulled by the so-called Czochralski method. In this method, a seed crystal of predefined orientation is immersed in the melt and then slowly extracted. Seed crystal and melt rotate in different directions. The surface tension between seed crystal and melt causes melt to be drawn off along with the seed crystal, said melt gradually freezes and as a result solidifies to a continuously growing single crystal. In this pulling process, the quartz glass crucible is subjected for several hours to high mechanical, chemical and thermal stress that it must withstand without undergoing appreciable plastic deformation. The larger the crucible and thus the volume of melt to be received therein, the longer the melting times usually are.

To enhance the thermal stability of the quartz glass crucible, it is suggested in EP-A 748 885 that the crucible should be provided with a surface layer of cristobalite. The melting point of cristobalite of about 1720° C. is much higher than the melting temperatures of conventional semiconductor materials (in the case of a silicon melt, the melting temperature is, for example, around 1420° C.). To generate the cristobalite surface layer, the glassy outer wall of a commercially available crucible of opaque, bubble-containing quartz glass is treated with a chemical solution containing substances that are conducive to the devitrification of quartz glass into cristobalite ("crystallization promoters"). Boron, alkaline-earth and phosphorus compounds are recommended as crystallization promoters; barium hydroxide is preferably used. When the quartz glass crucible is heated up to a temperature exceeding 1420° C.—for instance during the intended use in the pulling process—the surface of the pre-treated crucible wall crystallizes under formation of cristobalite, a fact which results in a higher mechanical and thermal strength of the quartz glass crucible.

Application of the crystallization promoter to generate the crystallized outer layer requires an additional processing stage at the end of the process that leads to high costs in the event of rejection due to a defect and is extremely difficult to render reproducible. For example, barium hydroxide is highly reactive in air; it tends to react with the carbon dioxide in the air to form barium carbonate. Precise weighing out of this substance is hampered as a result. In addition, uniform distribution of the crystallization promoter over the crucible surface and thus crystal growth are virtually uncontrollable. Transport or handling of the quartz glass crucible may abrade the crystallization promoter. Whether crystallization occurs in the desired manner is generally not predictable and only transpires when the quartz glass crucible is being used. In addition, barium exhibits only slight mobility in quartz glass, with the result that the thickness of the crystallized surface layer in the known quartz glass crucible is low; it is generally around 50 μm. Such a thin layer can easily flake off and be damaged in use. For this reason, the known quartz glass crucible is not suitable for receiving a large volume of melt and coping with the accompanying long process durations.

SUMMARY OF THE INVENTION

It is the object of the present invention to provide a quartz glass crucible with longer service life and to indicate an inexpensive method for the reproducible production of such a quartz glass crucible that enables a high yield with regard to the crucible and the semiconductor material for melting therein.

With regard to the crucible, starting from the type of quartz glass crucible mentioned at the beginning, this object is achieved according to the invention in that the crystallization promoter contains a first component acting in quartz glass—additionally to silicon—as a network former and/or a network modifier in quartz glass and a second, alkali-metal-free component acting in quartz glass as a breakpoint former, and that the outer layer (6) comprises a doping region (8) having a layer thickness of more than 0.2 mm containing said components being entrapped therein.

When used for pulling semiconductor crystals, the quartz glass crucible is heated to a temperature above the melting temperature of the respective semiconductor material (approx. 1425° C. for silicon). An essential aspect of the invention is that the quartz glass crucible has an outer layer containing entrapped crystallization promoter (in a doping region) which serves as the starting point for induction of crystallization in the outer surface of the quartz glass crucible during use. To this end, the crystallization promoter in the doping region is contained in a manner and quantity that is suited to effect crystallization of quartz glass to cristobalite at the elevated temperatures of the crystal pulling process, for example when the silicon in the quartz glass crucible is melted (above 1400° C.).

Crystallization during production of the quartz glass crucible is avoided. For, owing to the differences in the coefficients of thermal expansion of quartz glass and cristobalite and the phase transformation of β-cristobalite into α-cristobalite at 275° C., a crystallized region would induce mechanical stresses during cooling that can lead to cracks in or even to fracture of the crucible. In the ideal case, the quartz glass crucible exhibits no crystallization after manufacture, but at most shows microscopic crystallization nuclei in the doping region that are not identifiable under the light microscope. Only the temperature increase during intended use of the quartz glass crucible leads to crystallization, which essentially occurs in the doping region of the outer layer. This crystallization improves the mechanical and thermal stability of the quartz glass crucible and prolongs its service life.

The quartz glass crucible of the present invention differs from the known quartz glass crucible in several respects:

The crystallization promoter is entrapped in the doping region of the outer layer. The concentration and distribution of the crystallization promoter in the outer layer is predetermined during the manufacturing process. There is no risk of unintentional change in concentration or distribution, such as during transport or filling with melt. The distribution and concentration are therefore reproducible, and clear and inalterable until the crucible is used as intended.

A further essential difference from the known quartz glass crucible consists in the fact that the crystallization promoter comprises at least two components, namely a first component acting as "network former" or as "network modifier" in quartz glass, and at least a second, alkali-metal-free component acting as a "breakpoint former" in quartz glass.

The "second component acting as breakpoint former" is also termed hereinafter a "breakpoint former" for short. "Breakpoint formers" are considered to be ions that are breaking Si—O—Si bonds and thereby degrade the quartz glass network.

The "first component acting in quartz glass as network former and/or as network modifier" is hereinafter termed the "network former" for short unless an express distinction is drawn between "network former in the classic sense" and network modifier. "Network formers" in the classic sense are those ions whose oxides form a glass network through the formation of polyhedra whereas "network modifiers" are understood to be ions which, although they alter or "modify" the quartz glass network, do not break the network. "Network formers" in the classic sense for quartz glass are generally the oxides of the following components: titanium, zirconium, hafnium, germanium and tin. "Network modifiers" are considered to be, for example, boron, aluminum, gallium, phosphorus, arsenic, antimony, vanadium, niobium and tantalum.

The second component acting as breakpoint former contributes essentially to crystallization of the quartz glass. According to the invention, it is an alkali-metal-free component, so that the risk of contamination of the melt by alkali metal ions in the quartz glass crucible is reduced. The following components may serve as alkali-metal-free breakpoint formers: magnesium, calcium, strontium and barium.

The crystallizing action of the "breakpoint former" is supported by the additional "network former". This supporting action by the "network former" may be attributed to its influence on the stability of the glass structure. It is conducive to crystallization in the doping region at a lower concentration of "breakpoint former" than would be the case without the simultaneous presence of the "network former". A low concentration of "breakpoint former" has several advantages:

Small quantities of "breakpoint former" are sufficient to lower the viscosity of quartz glass. A low viscosity is disadvantageous to use as a quartz glass crucible. The fact that the concentration of "breakpoint former" necessary for crystallization can be kept low in the quartz glass crucible of the present invention means that its viscosity-lowering influence is lower.

Even when the distribution coefficient of the "breakpoint former" in silicon is low, nevertheless a proportion is always incorporated into the single crystal and, as a result, the electronic properties of the semiconductor material are impaired. For this reason, as well, it is favorable to keep the concentration of "breakpoint former" as low as possible and to set it only as high as is necessary to induce the desired crystallization of the quartz glass.

A "network former" can also cause crystallization in quartz glass, but only in high concentration. However, a high concentration of "network former" would have an unfavorable effect on the chemical and mechanical properties of the crucible and would increase the stress on the semiconductor material in the form of foreign substances. In the quartz glass crucible of the present invention, such a high concentration in the doping region is unnecessary since the "network former" is used in combination with a "breakpoint former" that facilitates crystallization. Moreover small amounts of "breakpoint former" and "network former" are more cost effective and more environmentally compatible.

The crystallization promoter—comprising a combination of a "network former" and a "breakpoint former"—thus ensures crystallization in the doping region that supports the mechanical stability of the quartz glass crucible, without the need for high concentrations of "network former" and "breakpoint former" to accomplish this. As a result, there is a lower risk, compared with the known crucible, that foreign substance will get into the semiconductor melt, so that a higher yield of suitable semiconductor material is attainable.

The crystallization promoter is contained in a doping region of the outer layer and entrapped therein. The doping region comprises the entire outer layer of the crucible or a section thereof. It is at least 0.2 mm thick, so that the crystallized layer developing therefrom has a commensurate minimum thickness, a fact which lowers the risk of detachment of, or damage to, the layer during intended use of the quartz glass crucible.

The quartz glass crucible of the present invention is provided with a transparent inner layer of quartz glass that is manufactured from naturally occurring raw materials (quartz) or from synthetic $SiO_2$. To avoid impairment of the inner layer through crystallization in the doping region, provision is made for spatial separation, spanning at least the inner region of the outer layer, between the inner layer and the doping region.

It has proved particularly favorable for the first component acting as network former to contain a tetravalent substance.

These are components that have the same valency as silicon ($Si^{4+}$) in the compound $SiO_2$. This ensures that the "network former" does not exert any influence on the electronic conditions in the single crystal if it were to get into the melt because it acts neither as a p-dopant nor as an n-dopant in the silicon single crystal. These are "network formers" in the classic sense. Elements other than such tetravalent "network formers", that is to say the elements described above as "network modifiers", which are trivalent or pentavalent substances, are readily conducive to entrainment of primarily alkali-metal-ion contaminants in the quartz glass by way of balancing the electronic valency relative to $Si^{4+}$. This "gettering" effect is avoided through the use of tetravalent "network formers".

The preferred tetravalent substances are zirconium ($Zr^{4+}$), titanium ($Ti^{4+}$), hafnium ($Hf^{4+}$) and/or germanium ($Ge^{4+}$).

A second component, containing a divalent, alkali-metal-free substance and acting as a breakpoint former, has proved to be particularly advantageous. Even low concentrations of "breakpoint former" are conducive to cristobalite formation.

According to the present invention, the concentration necessary for this is further reduced by the fact that, in addition to the "breakpoint former" or "breakpoint formers", one or more "network formers" is contained in the doping region.

The preferred substances are the divalent, alkali-metal-free barium ($Ba^{2+}$) and/or strontium ($Sr^{2+}$). Barium, in particular, is notable moreover for its low mobility in quartz glass, so that the crystallized zone, is readily restricted to the doping region and can be designed in accordance with the local distribution of the "breakpoint former".

The first and the second component advantageously have a distribution coefficient in silicon of less than $10^{-5}$. A small distribution coefficient ensures that the fewest possible components are incorporated into the crystal generated during the pulling process and thus that its electronic properties are not impaired.

A particularly successful embodiment of the quartz glass crucible of the present invention has proved to be that in which the first component and the second component are each contained in a concentration ranging from 0.003 mol-% to 0.02 mol-% in the doping region. The concentration value pertains to the concentration of these components in the quartz glass. At concentrations beneath the mentioned lower limit, complete crystallization in the doping region does not occur. It must be borne in mind that contaminants in the quartz glass generally promote cristobalite formation, so that, in the case of contaminated quartz glass, complete crystallization is to be expected even when the component concentration is beneath the lower limit. The concentration range described above as preferred therefore only applies under the proviso that the doping region—apart from the crystallization promoter added as dopant—consists of pure quartz glass. The upper limit indicated for the preferred concentration range arises from the need to keep the content of foreign substances as low as possible with respect to the necessary purity of the semiconductor material and stable melting conditions within the scope of crystal pulling. Concentrations of 0.006 mol-% (+/−0.002) for each of the first and the second component have proved particularly advantageous.

In a particularly preferred embodiment of the quartz glass crucible of the present invention, the first component and the second component are introduced into the doping region in the form of an oxide compound containing said components. A crystallization promoter in the form of an oxide compound containing the first component and the second component has several advantages.

First, the proportions of the respective components in such an oxide compound are predetermined in advance, so that weighing-out errors are reduced.

Moreover, this avoids decomposition problems that can arise if one or each of the components is introduced into the doping region in a separate chemical compound—such as in the form of a carbonate, nitrate, etc. For, at high temperatures, for example, carbonate decomposes to gaseous carbon dioxide, and nitrate to nitrous gases, a fact which leads to undesirable and uncontrollable gas formation and thus bubble formation in the crucible or the crystal pulling plant and to an unnecessary burden on the environment.

Also with respect to material costs, compound partners for the first or the second component, in separate chemical compounds, prove to be superfluous and are avoided in the present invention by using an oxide compound containing both components.

As a result of the absence of other compound partners of the respective components in the oxide compound, only the desired components (network former and breakpoint former) are introduced into the doping region, but undesirable foreign substances are not.

The preferred oxide compound is a ternary oxide such as barium titanate ($BaTiO_3$) or barium zirconate ($BaZrO_3$) or mixtures thereof. Crystallization of the outer layer is essentially effected by the barium component of these oxide compounds, supported by the respective titanate or zirconate component. The crystallization promoter in the form of barium titanate and barium zirconate is notable for having a comparatively low vapor pressure, so that little foreign substance gets into the semiconductor melt by evaporation. Examples of other suitable ternary oxides are barium arsenate and barium aluminate.

Barium and titanium and zirconium are notable for their relatively small distribution coefficient "k" in silicon. In the literature, the following values are quoted for "k": for Ba: $k<2.25\times10^{-8}$, for Ti: $k=1.7\times10^{-6}$ or $k\equiv2.0\times10^{-6}$, for Zr: $k=1.7\times10^{-7}$ or $k\equiv1.7\times10^{-8}$. The titanate and zirconate component has yet another effect under the condition that, in conjunction with reducing conditions in the crucible-manufacturing process, these components are reduced to suboxides or to the metals. Such a reduction can succeed because the redox potentials of tetravalent titanium and zirconium differ greatly from that of tetravalent silicon, so that the tetravalent titanium or zirconium is easier to reduce than tetravalent silicon and thus can be reduced during the crucible-manufacturing process in significant quantities to oxidation state II or III. The resultant reducing effect of these species persists during the intended use of the quartz glass crucible and thereby effects a reduction in bubble growth in the crucible wall. This effect may be attributed to the fact that the reduced species reacts with the bubble-forming gases (these are essentially oxygen released in the quartz glass by chemical reaction) to form an oxidized solid. In this respect, the reduced species has a "gettering effect" for the excess gases (oxygen) formed during the crystal-pulling process.

The quartz glass crucible advantageously has a doping region with a layer thickness of more than 1 mm, preferably of more than 2 mm. Crystallized layers with thicknesses of more than 1 mm or more than 2 mm are notable for having high mechanical and thermal stability. Another advantage of a thick, crystallized layer consists in the fact that during cooling of the heated crucible—after it has been used as intended—the discontinuous change in volume during phase transformation from β-cristobalite into α-cristobalite generates large mechanical stresses that have the effect of causing the quartz glass crucible to break into smaller parts. This facilitates removal of the crucible from the crystal-pulling apparatus.

Advantageously, the layer thickness is 10 mm max. A doping region thicker than 10 mm causes crystallization, which, to an extent depending on the crucible size, extends too close to the inner layer and thus may unfavorably influence the properties of the inner layer (especially its purity and freedom from bubbles).

It has proved useful that the quartz glass crucible has an essentially cylindrical side wall rotating about an axis of rotation, the doping region being formed as a rotating doping strip in the side wall. As a result, the crystallized region can be restricted to the minimum necessary for increasing the stability. The thickness and width of the layer crystallizing during intended use is very readily adjustable if mass transport of the components, which essentially effect crystallization, is largely absent. This is the case, for example, with barium ($Ba^{2+}$).

With regard to the method, starting from the method mentioned at the beginning, the aforementioned technical object is achieved in the present invention in such a manner that a first component acting as network former in quartz glass—in addition to silicon—and/or as network modifier in quartz glass and an alkali-metal-free second component acting as breakpoint former in quartz glass are used as crystallization promoter, and that said components are introduced into, and entrapped in, a doping region more than 0.2 mm thick in the outer layer.

In accordance with the present invention, the crystallization promoter is introduced into the doping region and entrapped therein in such a manner and quantity as to be suitable, when the quartz glass crucible is reheated, to effect crystallization to cristobalite in the region of the outer surface of the crucible. The crystallization starting from the doping region is intended to occur not during manufacture of the quartz glass crucible, but instead only during intended use of the crucible, for example during the melting of silicon at the start of the crystal-pulling process. Crystallization in the region of the outer layer improves the mechanical and thermal stability of the quartz glass crucible and prolongs its service life.

The method of the invention for manufacturing a quartz glass crucible in accordance with the present invention differs from the known method for manufacturing a quartz glass crucible in several respects:

The crystallization promoter is introduced into the doping region of the outer layer and entrapped there. This enables the concentration and distribution of the crystallization promoter to be uniquely predetermined. There is no risk of unintentional alteration in concentration or distribution, such as during transport or filling with melt, so that the method leads to reproducible results.

A further essential difference from the known manufacturing method consists in the fact that the crystallization promoter comprises at least two components, namely a first component acting as network former or as network modifier in quartz glass, and a second, alkali-metal-free component acting as a breakpoint former in quartz glass. With regard to the nature and action of the said components, reference is made to the explanations above concerning the crucible of the present invention.

The introduction of the crystallization promoter into the doping region of the outer layer occurs at an early stage of the method, namely during manufacture of the outer layer. The doping region comprises the entire outer layer of the quartz glass crucible or a part thereof; it has a thickness of at least 0.2 mm, so that the crystallized layer developing therefrom has a commensurate minimum thickness of more than 0.2 mm that reduces the risk of detachment and damage during use of the quartz glass crucible.

The crystallization promoter can be introduced into the doping region by generating the latter from $SiO_2$ grains that have been temporarily doped accordingly. Alternatively, the doping region may be subsequently doped with the first and/or lo second component via the gas phase or via a liquid. In a preferred approach, an outer layer with the doping region is generated by introducing $SiO_2$ grains into a melt mold and shaping them to a crucible-like layer of $SiO_2$ grains, with said components added to the $SiO_2$ grains prior to the shaping of the doping region, and then sintering the $SiO_2$ grains layer under formation of the outer layer.

The incorporation of the crystallization promoter (or the first and/or second component) into the grains or the doping region takes place prior to shaping of the outer layer in the context of grain preparation, which is necessary anyway. There is thus no additional processing step required during the crucible production to provide the outer layer with the crystallization promoter, as is the case with the known method described at the outset. In addition, the doping region is manufactured at the start of the melting process at a comparatively early stage of the method, so that rejects generated by doping is noticed in timely fashion, before further complicated processing steps have occurred.

The $SiO_2$ grains may be doped with the said components ("network former" and "breakpoint former"); in the preferred variant of the method, these components are added to the $SiO_2$ grains prior to shaping of the doping region, for example by manufacturing a corresponding grains mixture.

Advantageous embodiments of the method of the present invention arise from the further subclaims. With regard to the associated advantages and effects, reference is made to the explanations above concerning the quartz glass crucible of the present invention.

Preferably, a tetravalent substance is used for the first component acting as network former.

These are components that, in the corresponding binary or ternary oxides, have the same valency as silicon ($Si^{4+}$) in the binary compound $SiO_2$. With regard to the associated advantage concerning the electronic conditions inside the quartz glass crucible and inside the semiconductor melt contained in the crucible and in the single crystal, reference is made to the explanations above concerning the quartz glass crucible of the present invention. The preferred tetravalent substance is titanium ($Ti^{4+}$), zirconium ($Zr^{4+}$), hafnium ($Hf^{4+}$), germanium ($Ge^{4+}$) and/or tin ($Sn^{4+}$), this being simultaneously a "network former" in the classic sense.

It has proved favorable to use a divalent, alkali-metal-free substance as the second component acting as "breakpoint former". Such "breakpoint formers" lead to cristobalite formation even in low concentration, the concentration needed for crystallization being further reduced by combined use with one or more "network formers" in the doping region.

The preferred divalent, alkali-metal-free substance is barium ($Ba^{2+}$) and/or strontium ($Sr^{2+}$). In particular, barium as a large divalent cation is notable for having a low mobility in quartz glass, so that the crystallized zone can be readily restricted to a predetermined extension of the doping region.

It has proved particularly useful to incorporate the first component and the second component into the doping region in a concentration range of 0.003 mol-% to 0.02 mol-% each. The mentioned lower limit of the preferred concentration range arises from the need for adequate crystallization in the doping region during use of the crucible, and the upper limit arises from the need to keep the content of foreign substances with regard to the necessary purity of the semiconductor material and stable melt conditions as low as possible. Concentrations of roughly 0.006 mol-% (+/−0.002) have proved particularly advantageous for each of the first and second components.

The first component and the second component are preferably introduced into the doping region of the outer layer in the form of an oxide compound containing the said components. This method has several advantages.

First, the proportions of each component in an oxide compound are stoichiometrically predetermined, so that weighing-out errors are reduced.

Moreover, this avoids decomposition problems that can arise when one or each of the components is introduced into the doping region in a separate chemical compound, such as in the form of a carbonate, nitrate, etc. For, at high temperatures, for example, carbonate decomposes to gaseous carbon dioxide, and nitrate to nitrous gases, a fact that leads to undesirable and uncontrollable gas formation and thus to bubble formation in the crucible or the crystal pulling apparatus and to an unnecessary burden on the environment.

Also with respect to material costs, the compound partners of the first or the second component, in separate chemical compounds, prove to be superfluous and in accordance with the present invention are avoided by using an oxide compound containing both components. As a result of the absence of other compound partners of the respective components in the oxide compound, only the desired components (network former and breakpoint former) are introduced into the doping region, but undesirable foreign substances are not.

The oxide compound in a particularly preferred approach is a ternary oxide, especially in the form of barium titanate ($BaTiO_3$) or barium zirconate ($BaZrO_3$) or a mixture thereof. Examples of other suitable ternary oxides are barium arsenate and barium aluminate.

Crystallization of the outer layer is essentially effected by the barium component of the respective ternary oxide, supported by the respective titanate or zirconate component. The overall quantity of foreign substance necessary for crystallization is low (reference is made to the explanations on this above).

Crystallization promoters in the form of barium titanate and barium zirconate have a comparatively low vapor pressure, so that little foreign substance gets into the semiconductor melt by evaporation. Moreover, barium and titanium and zirconium are notable for having a relatively small distribution coefficient in silicon. Reference is made to the literature values quoted above.

The invention is explained in more detail below in the form of embodiments and one drawing. The sole drawing shows in FIG. 1 a schematic diagram of the wall of an embodiment of the quartz glass crucible of the present invention in a longitudinal section running parallel to the central axis.

DETAILED DESCRIPTION

The quartz glass crucible shown in FIG. 1 is intended for receiving molten silicon for pulling a silicon single crystal. It has an outer diameter of 28 inches and is rotationally symmetrical about the central axis 1.

The quartz glass crucible has a slightly curved base 2 that is connected to an essentially cylindrical side wall 4 via a heavily curved transition area (hereinafter called radius 3).

The internal surface of the quartz glass crucible is formed by a transparent inner layer 5 of highly pure, synthetic quartz glass that, depending on how it is formed, varies in thickness from 1 to 5 mm in the area of base 2, radius 3 and side wall 4. The inner layer 5 is connected to an outer layer 6 of opaque quartz glass with an average thickness of 15 mm in the side wall.

The outer layer 6 has an internal vitreous region 7 of pure, undoped, opaque quartz glass that borders an outer layer, which consists of opaque, doped quartz glass, and which is hereinafter called the "outer wall strip" or the "doping region" 8. Doping in doping region 8 consists of a compo nent acting in quartz glass as "network former" and a component acting in quartz glass as "breakpoint former". The doping-region 8 forms the outer surface of the crucible, stretching along the entire side wall 4 in a layer 4 mm thick, and tapering into radius 3.

The production of the quartz glass crucible of the present invention will first be discussed generally below and then in more detail with the aid of concrete examples of embodiments.

In a first process stage, crystalline grains of natural quartz, cleaned by means of hot chlorination, with a preferred grain size in the range of 90 μm to 315 μm, are filled into a metal mold that rotates about its longitudinal axis. Under the influence of centrifugal force and by means of a template, a rotationally symmetrical crucible-shaped layer of quartz grains is formed on the inner wall of the metal mold.

In a second process stage, a transparent inner layer is generated on the inner wall of the quartz grains layer by means of the so-called "arc melting process". To this end, as the metal mold is continually rotated, highly pure synthetic quartz grains are strewn in through an arc, which is lowered into the metal mold from above. The grains strewn in through the arc are softened and thrown against the inner wall of the layer of quartz grains where they melt. The maximum temperature achieved on the inner wall is in excess of 2100° C. This lead to the formation of a melt front propagating outwards towards the metal mold, as a result of which the inner layer melts to transparent quartz glass and the layer of quartz grains is sintered to form an outer layer of opaque quartz glass. Melting is complete before the melt front reaches the metal mold. The inner surface of the quartz glass crucible is thus formed by a smooth, vitreous, bubble-free, highly-pure inner layer of synthetic $SiO_2$ that is firmly attached to the outer layer.

On account of the high purity of the synthetic inner layer, the tendency of the inner layer to undergo crystallization is low, so that the emission of crystal particles into the semiconductor melt while cristobalite is forming on the surface of the inner layer is avoided and as a result the service life of the crucible is improved.

The arc is ignited under atmospheric conditions (in air) by three graphite electrodes. Burn-off of graphite leads to the formation of $CO_2$ and CO, and the Boudouard equilibrium is clearly shifted in favor of CO formation because of the elevated temperatures of several thousand degrees Celsius, so that an overall reducing melt atmosphere is created.

A unique feature of the invention consists in the fact that, during the manufacture of the outer layer, a crystallization promoter comprising at least a further (additionally to $SiO_2$) component acting as network former and at least one component acting as breakpoint former is introduced into the doping region and entrapped therein.

Manufacture of the outer layer and the incorporation of the crystallization promoter into the doping region is discussed in more detail below with the aid of examples of embodiments.

EXAMPLE 1

A mixture of quartz grains (quartz sand) with commercially available barium titanate powder is obtained by mixing in a drum-hoop mixer. The mixture contains 0.002 mol barium titanate per kg quartz grains; the quantity weighed out is 466 mg $BaTiO_3$/kg quartz grains.

When the layer of quartz grains is being shaped, the mixture is formed into a doped outer wall strip around the axis of rotation that ends on the outer wall of the layer of quartz grains and has a thickness of 3 mm in the finished crucible. The outer wall strip doped with barium titanate is shaped such that it extends down 5 cm from the upper rim of the finished crucible.

Subsequent application of the inner layer to the inner wall of the layer of quartz grains and sintering of the crucible wall by means of arc melting yields the quartz glass crucible of the present invention. The outer wall strip has a thickness of about 3 mm after sintering. Crystallization, especially in the region of the outer wall strip, is not visible to the naked eye.

EXAMPLE 2

A mixture of quartz grains with barium titanate powder is obtained by mixing in a drum-hoop mixer. The mixture contains 0.001 mol barium titanate per kg quartz grains; the quantity weighed out is 233 mg $BaTiO_3$/kg quartz grains.

When the layer of quartz grains is being shaped, the mixture is formed into a doped outer wall strip about the axis of rotation. The outer wall strip ends on the outer wall of the layer of quartz grains and extends down 10 cm from the upper rim in the finished crucible.

Subsequent application of the inner layer to the inner wall of the layer of quartz grains and sintering of the crucible wall (including melting of the layer of quartz grains) by means of arc melting yields the quartz glass crucible of the present invention. The outer wall strip has a thickness of about 4 mm after sintering. Crystallization, especially in the region of the outer wall strip, is not visible to the naked eye.

EXAMPLE 3

A mixture of quartz grains with barium titanate powder is obtained by mixing in a drum-hoop mixer. The mixture contains 0.001 mol barium titanate per kg quartz grains; the quantity weighed out is 233 mg $BaTiO_3$/kg quartz grains.

The mixture is used to generate a doping region ending on the external surface during shaping of the layer of quartz grains, the doping region extending over the entire side wall of the quartz glass crucible (excluding the base section).

Subsequent application of the synthetic inner layer to the inner wall of the layer of quartz grains and sintering of the crucible wall by means of arc melting yields the quartz glass crucible of the present invention as shown in FIG. 1. The doping region containing barium titanate has a thickness of about 3 mm after sintering. Crystallization, especially in the doping region, is not visible to the naked eye.

EXAMPLE 4

A mixture of quartz grains of a particle size ranging from 90 μm to 315 μm with commercially available barium zirconate powder is obtained by mixing in a drum-hoop mixer. The mixture contains 0.002 mol barium zirconate per kg quartz grains; the quantity weighed out is 552 mg $BaZrO_3$/kg quartz grains.

The mixture is used to generate a doping region ending on the external surface during shaping of the quartz grains layer, the doping region extending over the entire side wall of the quartz glass crucible (excluding the base area).

Subsequent application of the inner layer to the inner wall of the quartz grains layer and sintering of the crucible wall by means of arc melting yields the quartz glass crucible of the present invention. The doping region has a thickness of about 5 mm after sintering. Crystallization is not visible to the naked eye.

EXAMPLE 5

A mixture of quartz grains with barium zirconate powder is obtained by mixing in a drum-hoop mixer. The mixture contains 0.001 mol barium zirconate per kg quartz grains (the quantity weighed out is 276 mg $BaZrO_3$ per kg quartz grains).

The mixture is used to generate a doping region ending on the external surface during shaping of the quartz grains layer, the doping region extending over the entire side wall of the quartz glass crucible (excluding the base area).

Subsequent application of the synthetic inner layer to the inner wall of the layer of quartz grains and sintering of the crucible wall by means of arc melting yields the quartz glass crucible of the present invention as shown in FIG. 1. The doping region containing the barium zirconate in the finished crucible has a thickness (after sintering) of about 6 mm. Crystallization, especially in the doping region, is not visible to the naked eye.

The crucibles prepared in accordance with Examples 1 to 5 are broken up and chips are prepared for a "Crystallization Test", a "Vacuum Bake Test" and a "24-Hour Vacuum Bake Test".

Crystallization Test

In the crystallization test, the melting phase during crystal pulling is simulated. The temperature program employed roughly matches the temperature in the radius of a 28" crucible during the melting phase. This is intended to ensure that a crystalline layer of adequate thickness has been created by the start of crystal pulling. The chips are then evaluated graphically. To this end, the samples are photographed and the layer thickness is measured.

Vacuum Bake Test

The Vacuum Bake Test simulates the temperature and the pressure conditions during standard crystal pulling in order to assess bubble growth in the inner layer of the crucible. To this end, samples from the base, radius and side wall of the crucible are kept for four hours at 1600° C. and 10 mbar. The chips are then sliced into thin sections and photographs of the bubbles on the inner layers of the samples are taken.

24-Hour Vacuum Bake Test

The 24-Hour Vacuum Bake Test is used to simulate bubble growth, especially of the inner layer during a particularly long-lasting process, as is realistically possible with the use of 28" crucibles. To this end, the samples are kept for 24 hours at 1600° C. and 10 mbar. Bubble growth is then examined with the aid of the thin sections. The 24-Hour Vacuum Bake Test also reveals the final crystallization behavior of the crucible. After 24 hours, crystallization is almost complete, so that from this test it is possible to establish if the crystallization migrates, e.g., into regions that should not crystallize. For this reason, samples from the base, radius, side wall (bottom, center, top) are studied so that an overall picture of crystallization in the crucible can be created.

Results

Samples taken from the quartz glass crucibles prepared in accordance with Examples 1 to 5 were subjected to the aforementioned tests. The results are shown in Table 1.

TABLE 1

| Sample | Crystallization test Layer thickness [mm] | Vacuum Bake Test Bubble formation | 24 h Vacuum Bake Test Bubble formation | Crystallization |
|---|---|---|---|---|
| 1 | 3 | Bubble growth comparable or better than in quartz glass crucibles without outer wall doping | Bubble growth comparable or better than in quartz glass crucibles without outer wall doping | Strip |
| 2 | 4 | | | completely crystallized |
| 3 | 3 | | | Doping region |
| 4 | 5 | | | completely |
| 5 | 6 | | | crystallized |

The quartz glass crucible (sample 1) prepared in accordance with Example 1 exhibited crystallization growth in a strip approx. 5 cm wide on the upper wall. It transpired that the crystallized layer extends into the vicinity of the inner layer.

The quartz glass crucible (sample 2) prepared in accordance with Example 2 exhibited on account of the lower concentration of crystallization promoter slightly less, yet completely adequate crystallization in the upper outer wall of the quartz glass crucible.

When the doped outer wall strip is being prepared in accordance with Examples 1 and 2, defined local distribution of the crystallization promoter must be ensured because the doped layer must under no circumstances extend as far as the inner layer.

In the quartz glass crucible (sample 3) prepared in accordance with Example 3, the entire outer wall is doped with the crystallization promoter (barium titanate). The doped region extends on the outer surface from the upper edge of the quartz glass crucible down into the radius between the base and the wall. The method led to complete crystallization of the doping region of the outer wall in the crystallization test. The crystallized layer is of uniform thickness and tapers in the radius down towards the base. The shape of the crystallized layer corresponds exactly to the desired shape. The crystallized layer does not come close to the inner layer in any region.

In the quartz glass crucible (sample 4) prepared in accordance with Example 4, crystallization in the crucible was comparable to that in the crucible prepared in accordance with Example 3.

The quartz glass crucible (sample 5) prepared in accordance with Example 5 showed the same crystallization result as the crucible prepared in accordance with Examples 3 and 4. The thickness of the crystallization layer is 6 mm. The energy conditions during doping with $BaZrO_3$, however, are conducive such that the crucible, in contrast to doping with $BaTiO_3$, can be melted with much fewer process modifications.

The invention claimed is:

1. A method for manufacturing a quartz glass crucible said method comprising producing a crucible base body comprising an outer layer of an opaque quartz glass and an inner layer, wherein at least part of the outer layer in an outer region surrounding an inner region is provided with a crystallization promoter which, on heating of the quartz glass crucible during said crystal pulling, causes crystallization of quartz glass with formation of cristobalite, wherein a first component other than silicon that acts in quartz glass as a network former or as a network modifier, and an alkali-metal-free-second component acting as breakpoint former in quartz glass are used as to promote crystallization, and wherein said components are introduced into and entrapped in a doping region of the outer layer, said doping layer having a layer thickness of more than 0.2 mm.

2. A method according to claim 1, wherein the outer layer having the doping region is generated by introducing $SiO_2$ grains into a melting mold so as to be shaped therein into a crucible-shaped layer of $SiO_2$ grains, wherein said components are added to the $SiO_2$ grains before shaping of the doping region, and then the layer of $SiO_2$ grains is sintered so as to form the outer layer.

3. A method according to claim 1, wherein a tetravalent substance that acts as a network former is used as the first component.

4. A method according to claim 3, wherein the tetravalent substance comprises one or more elements selected from the group consisting of titanium ($Ti^{4+}$), zirconium ($Zr^{4+}$), hafnium ($Hf^{4+}$), germanium ($Ge^{4+}$) and tin ($Sn^{4+}$).

5. A method according to claim 1, wherein the second component contains a divalent substance that does not contain any alkali metal.

6. A method according to claim 5, wherein the divalent substance comprises one or more elements from the group consisting of barium ($Ba^{2+}$) and, strontium.

7. A method according to claim 1, wherein the first component and the second component are contained in the doping region of the outer layer in the form of an oxide compound containing said components.

8. A method according to claim 7, wherein the oxide compound consists essentially of a ternary oxide.

9. A method according to claim 8, wherein the ternary oxide is barium titanate ($BaTiO_3$), barium zirconate ($BaZrO_3$), or a mixture thereof.

10. A quartz glass crucible for crystal pulling, said crucible comprising: a crucible wall, comprising an outer layer of opaque quartz glass and an inner layer, wherein the outer layer has an inner region and an outer region, said outer layer being provided with a crystallization promoter that effects crystallization of quartz glass with formation of a cristobalite when the quartz glass crucible is heated during said crystal pulling, wherein the crystallization promoter contains a first component other than silicon that acts in quartz glass as a network former or a network modifier and a second, alkali-metal-free component that acts in quartz glass as a breakpoint former, and wherein the outer layer has a doping region having a layer thickness of more than 0.2 mm and containing said components entrapped therein.

11. A quartz glass crucible according to claim 10, wherein the first component acts as a network former and contains a tetravalent substance.

12. A quartz glass crucible according to claim 11, wherein the tetravalent substance comprises one or more elements from the group consisting of titanium ($Ti^{4+}$), zirconium ($Zr^{4+}$), hafnium ($Hf^{4+}$), germanium ($Ge^{4+}$) and tin ($Sn^{4+}$).

13. A quartz glass crucible according to claim 10, wherein the second component contains a divalent substance that does not contain alkali metal.

14. A quartz glass crucible according to claim 13, wherein the divalent substance comprises one or more elements from the group consisting of barium ($Ba^{2+}$) and strontium.

15. A quartz glass crucible according to claim 10, wherein the first component and the second component each have a distribution coefficient in silicon of $10^{-5}$ or less.

16. A quartz glass crucible according to claim 10, wherein the first component and the second component are each contained in a concentration ranging from 0.003 mol-% to 0.02 mol-% in the doping region.

17. A quartz glass crucible according to claim 10, wherein the first component and the second component are contained in the doping region in the form of an oxide compound containing the said components.

18. A quartz glass crucible according to claim 17, wherein the oxide compound consists of a ternary oxide.

19. A quartz glass crucible according to claim 17, wherein the ternary oxide is barium titanate ($BaTiO_3$), barium zirconate ($BaZrO_3$), or a mixture thereof.

20. A quartz glass crucible according to claim 10, wherein the doping region has a layer thickness of more than 0.5 mm.

21. A quartz glass crucible according to claim 20, wherein the layer thickness is 10 mm or less.

22. A quartz glass crucible according to claim 10, wherein the quartz glass crucible has an essentially cylindrical side wall about the axis of rotation, and wherein the doping region is formed as a doping strip in the side wall.

23. A method according to claim 10, wherein the first component and the second component are each introduced in a concentration ranging from 0.003 mol-% to 0.02 mol-% in the doping region.

24. A quartz glass crucible according to claim 1, wherein the doping region has a layer thickness of more than 2 mm.

25. A quartz glass crucible according to claim 24, wherein the layer thickness is 10 mm or less.

\* \* \* \* \*